(12) United States Patent
Gallagher et al.

(10) Patent No.: US 7,855,862 B1
(45) Date of Patent: Dec. 21, 2010

(54) ELECTROSTATIC DISCHARGE (ESD) CIRCUIT AND METHOD THAT INCLUDES P-CHANNEL DEVICE IN SIGNAL PATH

(75) Inventors: Kevin Gallagher, Midleton (IE); Gerald Murphy, Carrigrohane (IE); Andrew Walker, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 595 days.

(21) Appl. No.: 11/726,612

(22) Filed: Mar. 21, 2007

Related U.S. Application Data

(60) Provisional application No. 60/786,495, filed on Mar. 28, 2006.

(51) Int. Cl.
*H02H 9/00* (2006.01)
(52) U.S. Cl. .................................... 361/56
(58) Field of Classification Search .............. 361/56
See application file for complete search history.

(56) References Cited

U.S. PATENT DOCUMENTS

| | | | | |
|---|---|---|---|---|
| 3,947,727 A * | 3/1976 | Stewart | ............ | 361/91.5 |
| 4,086,642 A * | 4/1978 | Yoshida et al. | ............ | 361/91.5 |
| 4,691,217 A * | 9/1987 | Ueno et al. | ............ | 257/359 |
| 5,329,143 A * | 7/1994 | Chan et al. | ............ | 257/173 |
| 5,905,621 A * | 5/1999 | Drapkin | ............ | 361/111 |
| 5,952,850 A * | 9/1999 | Hojo et al. | ............ | 326/83 |
| 6,104,588 A | 8/2000 | Hariton et al. | ............ | 361/111 |
| 6,248,616 B1 | 6/2001 | Ravanelli et al. | ............ | 438/138 |
| 6,274,909 B1 * | 8/2001 | Chang et al. | ............ | 257/355 |
| 6,522,511 B1 | 2/2003 | John et al. | ............ | 361/56 |
| 6,611,154 B2 | 8/2003 | Grasso et al. | ............ | 326/83 |
| 6,700,431 B1 * | 3/2004 | Fotouhi et al. | ............ | 327/404 |
| 6,710,990 B2 | 3/2004 | Walker et al. | ............ | 361/56 |
| 6,809,954 B1 | 10/2004 | Madan et al. | ............ | 365/145 |
| 6,822,840 B2 * | 11/2004 | Tan | ............ | 361/56 |
| 7,184,253 B1 | 2/2007 | Hartranft et al. | ............ | 361/111 |
| 7,564,287 B2 * | 7/2009 | Chen | ............ | 327/310 |
| 2004/0190209 A1 * | 9/2004 | Jozwiak et al. | ............ | 361/56 |
| 2005/0275453 A1 | 12/2005 | Douts et al. | ............ | 330/9 |
| 2006/0267132 A1 * | 11/2006 | Lee | ............ | 257/509 |

OTHER PUBLICATIONS (Pavan et al.) P. Pavan, A. Pellesi, G. Meneghesso and E. Zanoni, "Effects of ESD protections on latch-up sensitivity of CMOS 4-stripe structures", Microelectronics and Reliability vol. 37, Issues 10-11, Oct.-Nov. 1997, pp. 1561-1564.*
USPTO Notice of Allowance for U.S. Appl. No. 11/332,676 dated Nov. 6, 2006; 10 pages.

* cited by examiner

*Primary Examiner*—Robert DeBeradinis
*Assistant Examiner*—Scott Bauer

(57) ABSTRACT

One example of an ESD protection circuit (100) can include a p-channel field effect transistor (PFET) (110) having a source-drain path connected between a pad (102) and a protected circuit (106). In an ESD event, PFET (110) can provide an ESD discharge path between pad (102) and a high power supply node (114) or low power supply node (112).

5 Claims, 3 Drawing Sheets

ELECTROSTATIC DISCHARGE (ESD) CIRCUIT AND METHOD THAT INCLUDES P-CHANNEL DEVICE IN SIGNAL PATH

This application claims the benefit of U.S. Provisional Patent Application Ser. No. 60/786,495, filed on Mar. 28, 2006, the contents of which are incorporated by reference herein.

TECHNICAL FIELD

The present invention relates generally to integrated circuit devices, and more particularly to electrostatic discharge (ESD) protection circuits.

BACKGROUND OF THE INVENTION

Typically, integrated circuit devices can have interface pads that provide external connections to circuit structures, and include some sort of protection against ESD events. An ESD event can include the transfer of a significant amount of electrical energy to an integrated circuit interface pad in a very short time (usually tens to hundreds of nanoseconds). The integrated circuit must be capable of dissipating the energy from the ESD event to prevent damage to circuits contained in the integrated circuit.

To assist in understanding various of the disclosed embodiments, a conventional ESD protection circuit will first be described.

Referring now to FIG. 6, a conventional ESD protection circuit is shown in a schematic diagram and designated by the general reference character 600. An ESD protection circuit 600 can include an input pad 602, an input resistance 604, an input buffer circuit 606, a local clamp 608, and an input ESD protection structure 610. Local clamp 608 and input buffer circuit 606 can be connected to a low power supply connection (VSS). Circuit 600 can also include an ESD protection structure 610 connected to input pad 602. A power supply connection VSS can include an inherent resistance Rs, due to conductive lines, diffusions, contact resistance, etc.

An ESD event at input pad 602 can result in a potential building with respect to a low power supply line and input pad 602, particularly if a resistance VSS is not insubstantial (e.g., greater than 1 ohm). Local clamp 608 can be an n-channel metal-oxide-semiconductor (MOS) device in a grounded-gate configuration. Thus, local clamp 608 can protect gates of the transistors within input buffer circuit 606 by clamping such gates to a VSS node 612 once a potential exceeds a threshold voltage of the transistor.

Although not shown in FIG. 6, an ESD protection arrangement can also include a clamping device between power supply voltage nodes that can clamp such supply nodes together during an ESD event.

ESD events can take a variety of forms. Four particular types will now be described with reference to FIG. 6. A first type of ESD event can be a negative "zap" at input pad 602 with respect to a low power supply node. In such an arrangement, a p-n junction within ESD protection structure 610, formed by a p-type substrate and n+ source, can forward bias, clamping input pad 602 to VSS node 612.

A second type of ESD event can be a negative zap at input pad 612 with respect to a high power supply node. Initially, the above described p-n junction of ESD protection structure 610 can forward bias, causing low power supply node 612 to drop in potential, while a high power supply node remains at a ground potential. Eventually, a main clamping device between a high power supply node and low power supply node will "snap back" due to an excessive drain-to-source (Vds) potential. It is understood that clamp-type ESD protection devices can be designed with special layout instructions, and thus can recover from such events.

A third type of ESD event can be a positive zap at input pad 602 with respect to a low power supply voltage node. In such an event, an excessive Vds can build across ESD protection device 610, and the device can snap back.

A fourth type of ESD event can be a positive zap at input pad 602 with respect to a high power supply voltage node. In this case, ESD protection device 610 can snap back, pulling up the potential at a low power supply node 612. In the case where device 610 has a body region formed in a p-type substrate, the entire integrated device can function as a large diode, with n-type wells (which have bias connections to a high power supply node via n+ type tap diffusions) forming diodes with the p-type substrate (which have bias connections to a low power supply node via p+ type tap diffusions). In the event input pad 602 has a low supply connection that is not a p-type substrate, the integrated circuit device can include back-to-back diodes that connect such a node to the substrate. Such back-to-back diodes will eventually conduct in an ESD event, providing the same type clamping effect.

A drawback to a conventional approach like that of FIG. 6 can be the constraints introduced into device design by having to include a local clamp. In particular, a local clamp is typically provided in close proximity to each input buffer, and thus can make input buffer design awkward. This can be further complicated by special layout rules that may be required for n-channel devices included in ESD protection circuits. Still further, a local clamp can typically be a relatively large device, and thus can be difficult to accommodate in dense layout areas and/or can compromise critical layout areas (those requiring matching). Finally, in a normal mode of operation, the grounded-gate of NMOS device of local clamp 608 can present an additional capacitive load at the input.

DETAILED DESCRIPTION

Various embodiments of the present invention will now be described in detail with reference to a number of drawings. The embodiments show ESD protection circuits and methods that can disconnect a signal pad from a potentially vulnerable input circuit in the event of an ESD event. Such an arrangement can help isolate the input of a vulnerable circuit from a power supply node (e.g., low power supply node) during the ESD event, thus preventing such a circuit from being damaged. Particular embodiments may eliminate the need for local clamping devices like those in conventional approaches.

Figure 1:
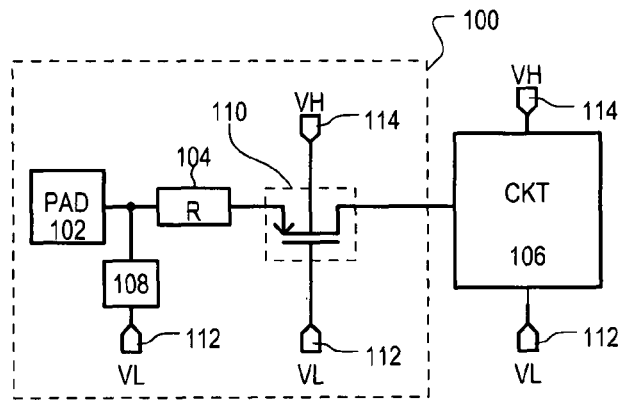
FIG. 1 is a block schematic diagram of an electrostatic discharge (ESD) protection circuit according to a first embodiment.

An ESD protection circuit according to a first embodiment is shown in FIG. 1 and designated by the general reference character 100. A circuit 100 can include a conductive pad 102, an input resistance 104, and a supply connect circuit 108. ESD protection circuit 100 can provide protection for an input circuit 106. In addition, and unlike conventional approaches such as those in FIG. 6, a circuit 100 can also include p-type metal-oxide-semiconductor (MOS) gate field effect transistor (PFET) 110 having a source-drain path connected between conductive pad 102 and protected circuit 106. Of course, as used herein, the term MOS is not intended to restrict the device to any particular type of gate insulator material. A gate of PFET 110 can be connected to a low power supply node 112 and a body of PFET 110 can be connected to a high power supply node 114.

A pad 102 can provide a physical connection for signals to and/or from an integrated circuit device. Accordingly, a pad 102 can include a conductive structure for receiving a bonding wire or other package structure (bump, etc.) that can provide a signal path to an external connection. Thus, a pad 102 may be an input pad that receives signals from an external source, an output pad that generates signals for use externally, or an input/output (I/O) pad that both sends and receives signals.

An input resistance 104 can be a passive circuit element, such as a resistor formed in a substrate of an integrated circuit device. Alternatively, part of such a resistance can be formed by inherent connections of the device. In one approach, input resistance 104 can be designed to meet a predetermined specification essentially by itself. In another approach, a specified input resistance value can be met by a resistor in addition to the inherent on resistance ($R_{ON}$) of PFET 110. Thus, inclusion of a protection PFET 110 may allow for reductions in size of an input resistor.

A protected circuit 106 can be a circuit having a signal path to conductive pad 102, and thus can be susceptible to ESD events. A protected circuit 106 can be connected between a high power supply node 114 and low power supply node 112, and may include an input circuit or output circuit, as but two examples.

A supply connect circuit 108 can provide a controllable impedance path between pad 102 and a low power supply node 112. Such a circuit can include a clamping circuit to further protect against ESD events, or may be a pull-down device in the event pad 102 is an I/O pad or output pad.

PFET 110 can provide protection for circuit 106 by providing discharge paths from pad 102 to a high power supply node 114 and/or low power supply node 112. Examples of such shunting arrangements will be described in more detail below.

Figure 6:
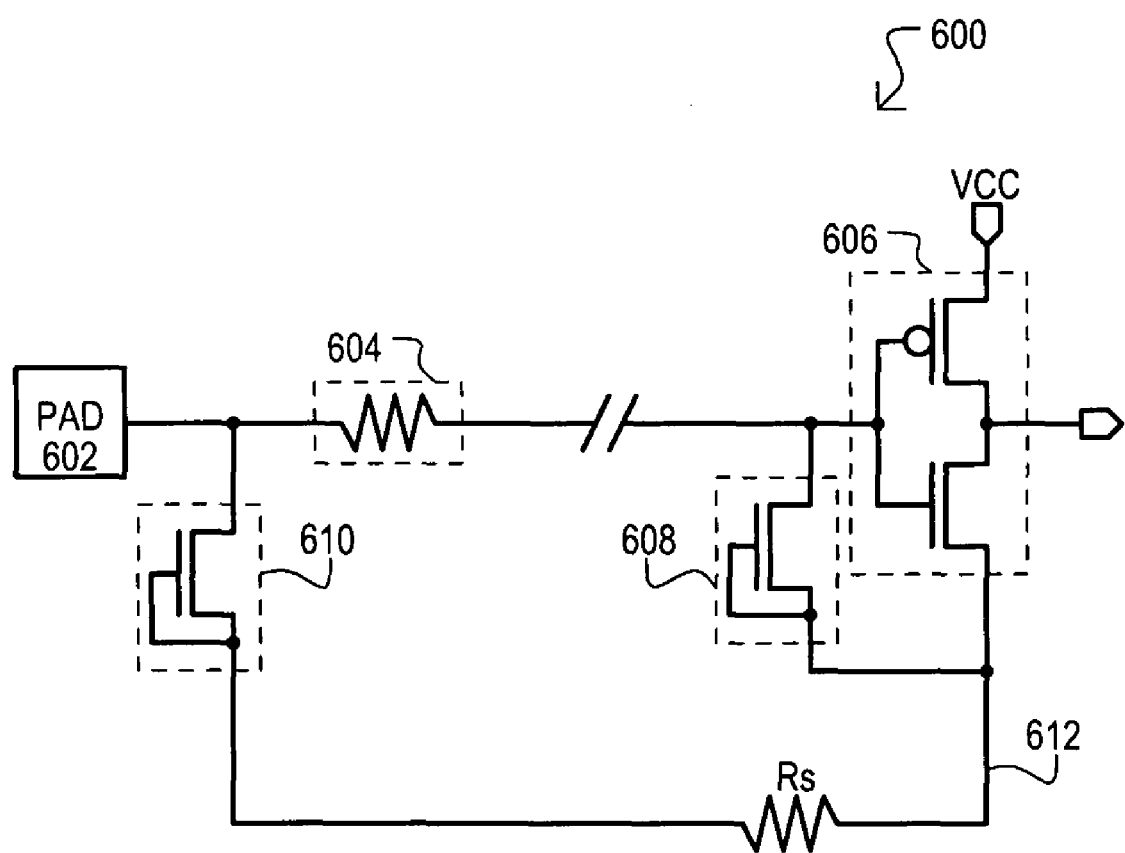
FIG. 6 is a schematic diagram of a conventional ESD protection circuit.

It is noted that use of a protection PFET 110 device, as shown, can result in reduction in areas over conventional approaches as a series switch PFET 110 can consume less area than conventional local clamps, like those of FIG. 6. Further, such a device may not be subject to special layout rules such as those that can affect local clamps. In addition, in operation, a capacitance presented by an "on" source-drain path can be considerably less than a grounded-gate connected transistor. Thus, input capacitance can be reduced over a conventional approach.

In this way, a p-channel transistor can be provided into a signal path to provide ESD protection.

Figure 2:
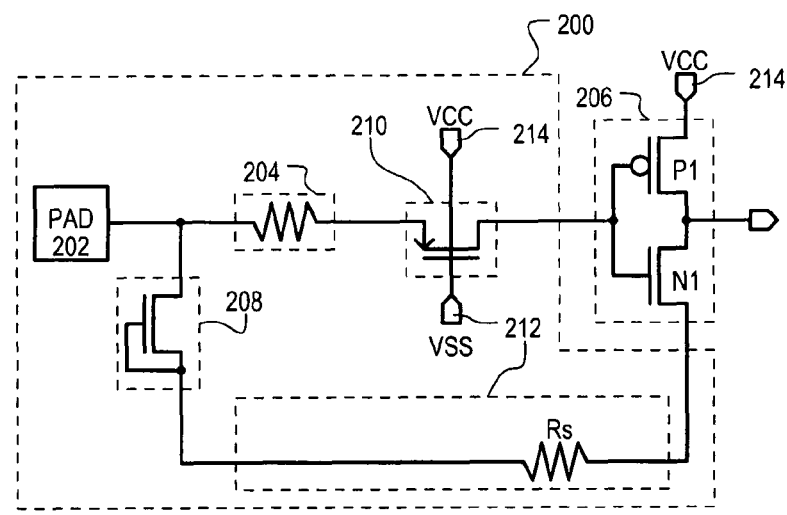
FIG. 2 is a schematic diagram of an ESD protection circuit according to a second embodiment.

Referring now to FIG. 2, an ESD protection circuit according to a second embodiment is shown in a schematic diagram, and designated by the general reference character 200. Circuit 200 can include some of the same general sections as FIG. 1, thus like sections are referred to by the same general reference character but with the first digit being a "2" instead of a "1". Circuit 200 can also protect an input circuit, and thus pad 202 can be an input pad that receives signals from an external source. In addition, protected circuit 206 can be an input buffer circuit that includes a buffer PFET P1 and buffer n-channel metal-oxide-semiconductor (MOS) field effect transistor (NFET) N1 in a CMOS inverter configuration between high power supply node 214 and low power supply node 212.

In the particular example of FIG. 2, a supply connect circuit 208 can include a grounded-gate connected NFET connected between pad 202 and lower power supply node 212. FIG. 2 also shows a low power supply line resistance Rs that can exist between protected circuit 206 and input pad 202.

Protection PFET 210 can provide discharge paths as noted above with respect to FIG. 1 (and discussed in greater detail below). As a result, input gates of transistor P1 and N1 within input buffer 206 can be protected from ESD events.

In this way, an input circuit can benefit from the inclusion of a PFET in the input signal path.

Figure 3:
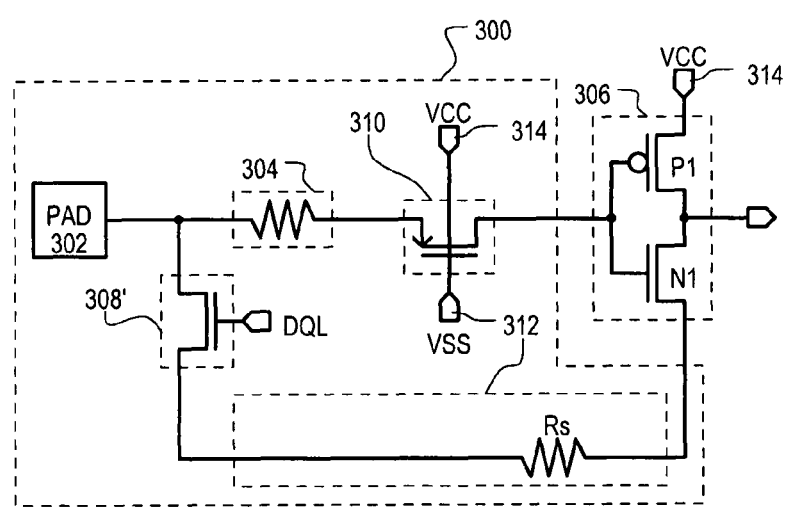
FIG. 3 is a schematic diagram of an ESD protection circuit according to a third embodiment.

Referring now to FIG. 3, an ESD protection circuit according to a second embodiment is shown in a schematic diagram, and designated by the general reference character 300. Circuit 300 can include some of the same general sections as FIG. 2, thus like sections are referred to by the same general reference character but with the first digit being a "3" instead of a "2".

Circuit 300 can differ from that of FIG. 2, in that it can protect an I/O circuit. Thus, pad 302 can be an I/O pad that both receives input signals and provides output signals. In addition, a power supply connect circuit 308' can be a pull-down circuit that can drive a pad 302 to a low power supply voltage VSS in response to an output signal DQL. Signal DQL can operate as a pull-down signal in data output operations and/or as a signal activated in the event of an ESD event.

In this way, an input circuit can benefit from the inclusion of a PFET in an I/O signal path.

Figure 4:
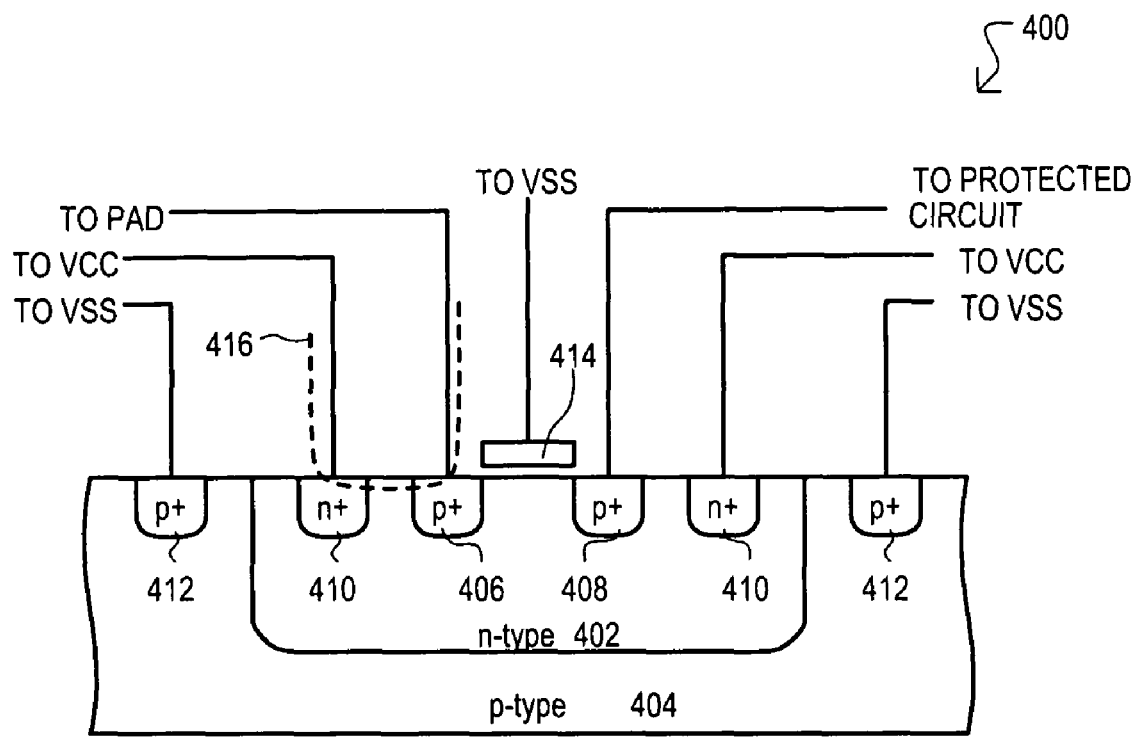
FIG. 4 is a side cross sectional view of a protection p-channel field effect transistor (PFET) that can be used in the embodiments.

Referring now to FIG. 4, an ESD protection PFET is described in a side cross sectional view, and designated by the general reference character 400. A PFET 400 can correspond to any of PFETs shown as 110, 210 or 310 in FIGS. 1-3.

In the particular example shown, a PFET 400 can include an n-type body region 402 formed in a p-type region 404. In one very particular arrangement, an n-type body region 402 can be an n-type well, and p-type region can be a p-type substrate. P-type source region 406 and drain region 408 can be formed within n-type body region 402. Source/drain regions (406/408) can have a higher doping concentration than a p-type substrate.

Referring still to FIG. 4, an n+ guard ring 410 can be formed within n-type body region 402 around source/drain regions (406/408), and can have a higher doping concentration than n-type body region 402. A p+ guard ring 412 can be formed around n-type body region 402, and can have a higher doping concentration than p-type region 404. PFET 400 can include a gate 414 formed between source and drain regions, and separated from n-type body region by a gate insulator.

A source region 406 can be connected to a conductive pad, a drain region 408 can be connected to a protected circuit, and a gate 414 can be connected to a low power supply node. N+ guard ring 410 can be connected to a high power supply node, and p+ guard ring 412 can be connected to a low power supply node.

During an ESD event (i.e., no power supply voltages), discharge paths can be provided between a pad and either power supply node. More particularly, as shown in FIG. 4, in response to one type of ESD event, a p-n junction formed by source region 406 and n-type guard ring 410 can be forward biased, forming a charge path 416 to a high power supply node.

In an operational mode (under power), protection PFET 400 can be biased to provide a low impedance signal path between a pad and a protected circuit.

In this way, a protection PFET can provide ESD discharge paths with respect to a pad.

While a protection PFET can protect a circuit from ESD event, such an arrangement can be limited by the threshold voltage of the transistor. In particular, an enhancement mode type protection PFET can only pass signals greater than a threshold voltage above a low power supply voltage (e.g., Vtp+VSS). To ensure lower potential signals can pass to (or from) a protected circuit, an ESD circuit can be modified. One example of such an approach is shown in FIG. 5.

Figure 5:
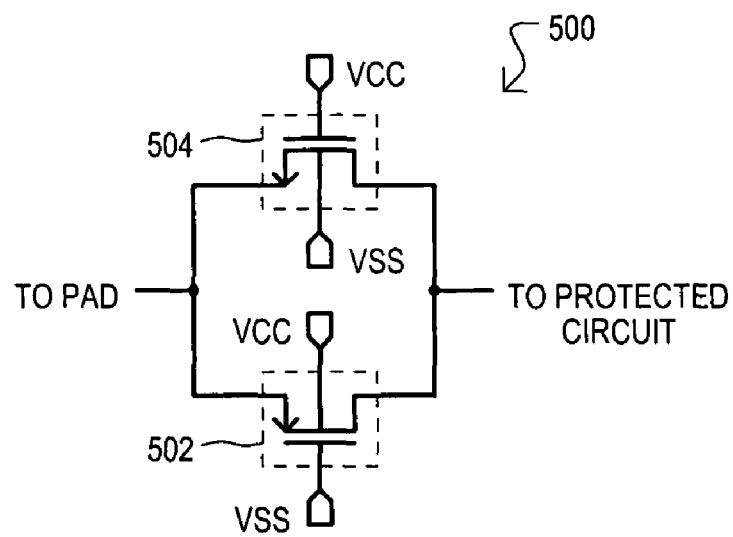
FIG. 5 is a schematic diagram of a signal path arrangement that can be used in the embodiments.

FIG. 5 shows an arrangement in which an NFET can be arranged in parallel with a protection PFET, to form a passgate type arrangement. Thus, a signal path arrangement 500 of FIG. 5 includes a protection PFET 502 arranged according to the embodiments above. In addition, arrangement 500 can include a gate NFET 504 having a source-drain path connected in parallel with that of protection PFET. Gate NFET 504 can have a body connected to a low power supply node, and a gate connected to a high power supply node.

A protection PFET as described above can be used as a protection measure in addition to local clamps, and need not be a substitute for such structures. Thus, alternate embodiments can have the same general structures as shown above, but in addition, may include a local clamp like that shown as 608 in FIG. 6.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit including ESD protection, comprising:
  a conductive signal pad configured to provide an electrical signal connection point to the integrated circuit from an external source;
  a protected circuit electrically connected to the conductive signal pad by a source-drain path of an ESD protection p-channel insulated gate field effect transistor (PFET), and connected to a high voltage power supply node and a low voltage power supply node that supply power for the protected circuit;
  the ESD protection PFET includes a gate connected to the low voltage power supply node that supplies power for the protected circuit, the PFET including a p-type source region and a p-type drain region both formed in an n-type well region formed in a larger p-type region;
  an n-type guard ring formed in the n-type well region of the ESD protection PFET and surrounding the p-type source region and the p-type drain region, the n-type guard ring having a higher doping concentration than the n-type well region;
  the n-type well region directly connected by the n-type guard ring to the high voltage power supply node that supplies power for the protected circuit, such that in response to one type of ESD event a forward current flow path is provided by a pn junction between the p-type source region and the n-type guard ring to the high voltage power supply node that supplies power for the protected circuit; and,
  a p-type guard ring in the larger p-type region and surrounding the n-type well region of the ESD protection PFET, the p-type guard ring having a higher doping concentration than the larger p-type region, the p-type guard ring electrically connected to the low voltage power supply node that supplies power for the protected circuit.

2. The integrated circuit of claim 1, further including:
  a clamping n-channel insulated gate FET (NFET) having a drain electrically connected to the conductive pad and a gate and drain electrically connected to the low voltage power supply voltage node.

3. The integrated circuit of claim 1, wherein the protected circuit comprises a CMOS inverter coupled between the low voltage and high voltage power supply nodes.

4. The integrated circuit of claim 1, further including:
  a passgate connected in parallel with the source-drain path of the protection PFET, the passgate comprising an n-channel insulated gate FET (NFET) having a source drain path directly electrically connected to the conductive signal pad, a gate electrically connected to the high voltage power supply node, a drain electrically connected to the protected circuit, and a body electrically connected to the low voltage power supply node.

5. The integrated circuit according to claim 1, further comprising a resistor between the protected circuit and the conductive signal pad.

* * * * *